United States Patent [19]

Rogers et al.

[11] Patent Number: 4,774,438
[45] Date of Patent: Sep. 27, 1988

[54] OSCILLOSCOPE TRACE ATTRIBUTE CONTROL SYSTEM

[75] Inventors: Gregory S. Rogers, Aloha; Timothy E. Bennington-Davis, Beaverton, both of Oreg.

[73] Assignee: Tektronix, Inc., Beaverton, Oreg.

[21] Appl. No.: 903,917

[22] Filed: Sep. 5, 1986

[51] Int. Cl.⁴ ............................................. G01R 13/28
[52] U.S. Cl. .................................................... 315/392
[58] Field of Search ................ 315/392, 395; 340/740, 340/742

[56] References Cited

U.S. PATENT DOCUMENTS

| | | | |
|---|---|---|---|
| 3,971,011 | 7/1976 | Borchert | 315/392 |
| 4,225,810 | 9/1980 | Ushiro | 315/392 |
| 4,529,916 | 7/1985 | Nozawa | 315/392 |

Primary Examiner—Theodore M. Blum
Attorney, Agent, or Firm—John P. Dellett; George T. Noe

[57] ABSTRACT

In a multiple trace oscilloscope wherein separate traces displayed on a cathode ray tube screen are updated in succession, a random access memory is addressed by the count output of a programmable counter which increments its count each time the oscilloscope finishes updating one trace prior to updating a next trace. Data stored in the random access memory at the storage location addressed by the count is utilized to control attributes of the next trace to be updated by controlling the switching positions of attribute control switches which select the horizontal, vertical and intensity control signals controlling the appearance of each trace.

13 Claims, 1 Drawing Sheet

OSCILLOSCOPE TRACE ATTRIBUTE CONTROL SYSTEM

BACKGROUND OF THE INVENTION

The present invention relates in general to multiple trace oscilloscopes and in particular to an apparatus for controlling the attributes of each trace.

In an analog oscilloscope, the path of an electron beam across the screen of a cathode-ray tube appears as a "trace" of glowing phosphor on the screen. The "attributes" of a trace relate to its appearance on the screen including its shape and intensity, and determine signals which control the vertical and horizontal deflection of the eletron beam as well as its intensity. In a multiple trace oscilloscope a single electron beam creates multiple traces on a cathode-ray tube screen, each trace having different attribute combinations. For example when traces represent different oscilloscope input waveforms, the vertical deflection of the beam is responsive to different vertical input signals for each trace. The horizontal sweep of the beam may also be accomplished by different horizontal sweep signals for each trace so that different waveforms can be simultaneously displayed using different horizontal time scales. Different signals may furthermore be used to control the intensity of the beam for each trace so that some traces appear brighter than others In a typical multiple trace oscilloscope, the traces are periodically updated (refreshed) utilizing either an "alternating" mode or a "chop" mode of trace update. In the alternating mode of operation, the oscilloscope updates one trace during each sweep of the beam across the screen so that several sweeps are required to update all of the traces once. In the chop mode of operation, the oscilloscope updates traces during each sweep by alternately updating sections of different traces as the beam sweeps once over the screen. Therefore when the chop mode is employed, each trace is actually "chopped," having horizontal gaps occurring during the times that the beam is updating other traces. Usually, however, the alternation in trace update occurs rapidly so that the gaps in each trace are small enough so each trace has a solid appearance.

The oscilloscope selects attributes for each trace utilizing attribute control switches for selecting the appropriate signals to be transmitted to vertical, horizontal and "Z axis" amplifiers for controlling the vertical and horizontal deflection and the intensity of the electron beam. Prior to updating each trace, the oscilloscope adjusts the selections made by these attribute control switches to set the desired attributes for the trace. Typically the attributes for each trace are predetermined by an operator utilizing knobs or pushbuttons on the front panel of the oscilloscope which send signals indicating the attributes the operator wants for each trace to a state machine. The state machine has a number of output states, each corresponding to a different permissible trace attribute combination. Each time the oscilloscope switches from updating one trace to updating a next trace, its sends a clock signal to the state machine causing the state machine to enter a next state determined according to the nature of the input signals from the front panel knobs or push buttons. The state machine output comprises a set of data bits which control the attribute control switches, causing them to select the appropriate vertical, horizontal and intensity control signals for the next trace to be updated.

The state machine must have one state corresponding to each permissible combination of trace attributes. When a multiple trace oscilloscope provides a great many different vertical, horizontal and intensity signal sources and is capable of displaying many traces simultaneously, such a trace attribute control state machine would require a prohibitively large number of states in order to permit any trace to have any possible combination of attributes. Since such a large state machine is impractical, multiple trace oscilloscopes permit only limited combinations of trace attributes for each trace. In addition, since the "next state" that a state machine enters is determined by the current state that it is in and by the input data provided during the current state, such state machines typically limit the order in which states can be entered and therefore limit the combinations of traces which can be displayed at the same time. It may be possible to display a first trace having a particular combination of attributes and it may be possible to display a second trace having another particular combination of attributes, but due to the sequencing limitations of the state machine, it may not be possible to display the two traces at the same time. What is needed and would be beneficial is a trace attribute controller for a multiple trace oscilloscope which would permit any possible combination of attributes to be independently specified for each trace.

SUMMARY OF THE INVENTION

According to one aspect of the present invention, a trace attribute controller for a multiple trace oscilloscope includes a random access memory (RAM) for storing, at separate addresses, trace attribute control data corresponding to each of multiple traces created by an electron beam traversing a cathode ray tube screen. A programmable counter counts a clock signal generated each time the beam updates a trace and addresses the RAM with its count output. The count indicates the next trace to be updated and when the RAM is addressed by the count, the RAM reads out the attribute control data corresponding to that trace. The attribute control data is then utilized to operate attribute control switches controlling attributes of the trace by selecting the appropriate signals controlling the vertical and horizontal deflection and the intensity of the beam as it updates the trace. Thus the attributes of each trace may be independently determined and each trace may be assigned any possible combination of attributes by storing appropriate attribute control data in the RAM.

It is accordingly an object of the present invention to provide an improved trace attribute controller for a multiple trace oscilloscope in which the attributes of each trace may be independently assigned and in which each trace may be assigned any possible combination of attributes.

The subject matter of the present invention is particularly pointed out and distinctly claimed in the concluding portion of this specification. However, both the organization and method of operation of the invention together with further advantages and objects thereof, will best be understood by reference to the following description taken in connection with the accompanying drawing.

DETAILED DESCRIPTION

Figure 1:
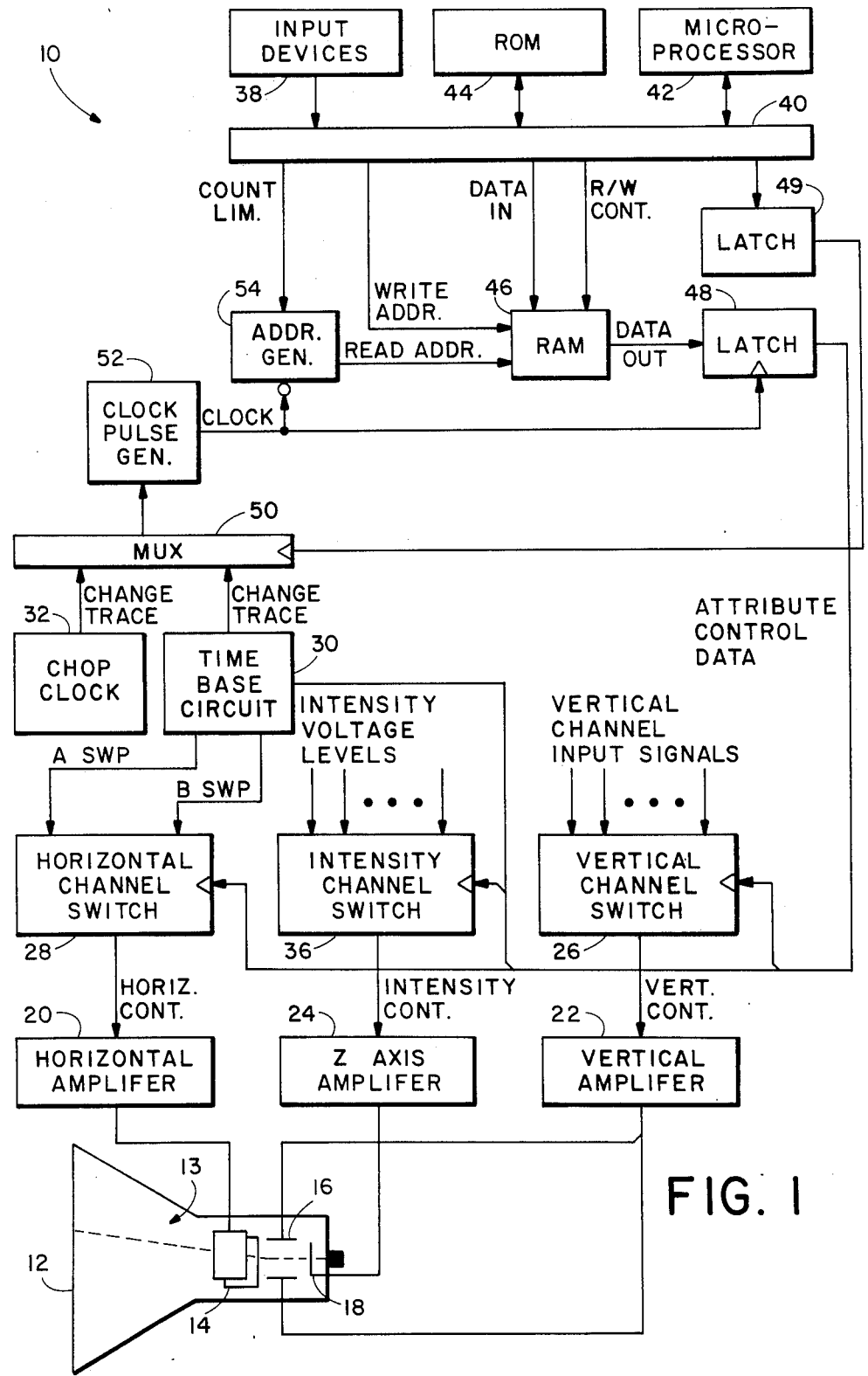
FIG. 1 is a block diagram of a multiple trace oscilloscope utilizing a trace attribute controller according to the present invention.

Referring to FIG. 1, depicting in block diagram form a multiple trace oscilloscope 10 utilizing a trace attribute control system according to the present invention, oscilloscope 10 is adapted to display multiple traces on a cathode-ray tube (CRT) 12 screen wherein separate excursions of an electron beam across the CRT screen appear as separate "traces" on the screen. The horizontal movement of the beam is controlled by a voltage applied across a pair of horizontal deflection plates 14 and the vertical motion of the beam is controlled by another voltage applied across a pair of vertical deflection plates 16. The intensity of the beam is controlled by a voltage applied to an electrode 18 in CRT 12.

The voltage applied across the horizontal deflection plates 14 is generated by a horizontal amplifier 20 in response to an input horizontal control signal supplied by a horizontal channel switch 28. The horizontal channel switch selects the horizontal control signal supplied to the horizontal amplifier 20 from between "A" and "B" sweep signals generated by a time base circuit 30. The voltage applied across the vertical deflection plates 16 of the CRT 12 is generated by a vertical amplifier 22 in response to an input vertical control signal transmitted through a vertical channel switch 26. The vertical channel switch 26 selects the vertical control signal sent to amplifier 22 from among a plurality of vertical channel input signals, typically generated by a device under test (not shown). The voltage applied to the electrode 18 of CRT 12 for controlling beam intensity is produced by a "Z axis" amplifier 24 in response to an intensity control signal from an intensity channel switch 36 which selects the intensity control signal from among a plurality of input intensity control voltage levels. The higher the voltage level selected, the more intense will be the beam and the brighter the resulting trace appearing on CRT 12.

The multiple trace oscilloscope 10 periodically refreshes (updates) each trace in order to keep the trace visible on the CRT screen. Different traces are updated sequentially utilizing either an "alternating" mode or a "chop" mode of trace update. The oscilloscope 10 utilizes either the A or the B sweep signal from the time base circuit 30 as the horizontal control signal for each trace and in the alternating mode the oscilloscope updates on trace during each sweep of the beam across the screen. The switching positions of switches 26, 28 and 36 may be changed after each sweep to select the appropriate beam control input signals for the next trace to be updated. In the chop mode of operation, a "chop clock" 32 causes the oscilloscope to change the switching positions of switches 26, 28 and 36 many times during each sweep so that sections of each trace driven by the A or the B sweep signal are regularly updated during each sweep.

The "attributes" of each trace control its appearance on the screen, including its shape and intensity, and are described in terms of the sources of the horizontal, vertical and intensity control signals. Each time the oscilloscope 10 switches from updating one trace to updating another trace, while either in the alternating or the chop mode of operation, it selects the attributes for the trace to be updated by appropriately setting the switch positions of the attribute control switches (i.e., horizontal channel switch 28, vertical channel switch 26, and intensity control switch 36) to select a particular combination of horizontal, vertical and intensity control signals for controlling the beam as it updates a trace.

The attributes for each trace are predetermined by an operator utilizing control knobs, push buttons or other input devices 38 suitably mounted on the front panel of the oscilloscope. Input devices 38 transmit signals indicating the attributes the operator has selected for each trace over a computer bus 40 to a microprocessor 42. Microprocessor 42 also accesses a read only memory (ROM) 44 and a dual-port random access memory (RAM) 46 via bus 40. Operating under program control of microcode instructions stored in ROM 44, the microprocessor determines the attributes the operator has selected for each trace from the input data provided by input devices 38.

The microprocessor 42 controls the attributes for each trace displayed on CRT 12 by storing appropriate "attribute control data" at an address in RAM 46 corresponding to the trace. In the preferred embodiment of the invention, oscilloscope 10 is capable of simultaneously displaying up to eight separate traces and therefore RAM 46 has at least eight addresses, one for each trace. When the operator provides attribute selection data to microprocessor 42 by way of input devices 38 indicating a change in the attribute of a particular one of the eight traces, the microprocessor changes the attribute control data stored at the RAM 46 address corresponding to the trace. The microprocessor 42 controls the read and write (R/W) operation of RAM 46 through control lines of bus 40, accesses the data inputs terminals of RAM 46 by way of data lines of bus 40, and addresses RAM 46 for a data write operation via address lines of bus 40. The address lines of bus 40 are connected to a write address input port of RAM 46.

In order to update a particular trace during oscilloscope operation, the attribute control data for the trace is read out of RAM 46 and latched by a latch 48 onto switching control inputs of horizontal channel switch 28, vertical channel switch 26, and intensity channel switch 36, causing the switches to select the appropriate horizontal, vertical and intensity control signals for the trace. After the update of that trace is completed, the attribute control data for the next trace to be updated is read out of RAM 46 and latched by latch 48 so as to readjust the settings of switches 26, 28, and 36 to select the appropriate attributes for the next trace. A portion of the trace attribute data is also applied as input to time base circuit 30 for controlling trigger levels, delay times, and adjustable characteristics of the A and B sweep outputs.

An additional latch 49, loaded by data from microprocessor 42 through bus 40, controls the switching state of a multiplexer 50 having two "CHANGE TRACE" indicating signal inputs, one from the chop clock 32 and one from the time base circuit 30. The chop clock 32 periodically transmits its CHANGE TRACE signal to the multiplexer 50 several times during each horizontal sweep of the beam 13 while time base circuit 30 transmits its CHANGE TRACE output signal to multiplexer 50 only once at the end of each full sweep of the beam across the screen of CRT 12. Both signals indicate that the oscilloscope 10 has completed updating (all or a portion of) one trace and is about to begin updating (all or a portion of) a next trace, although the chop clock 32 produces its CHANGE TRACE signal more often than the time base circuit 30 produces its CHANGE TRACE signal. When the oscilloscope 10 is operating in the alternating mode, the A and/or B sweeps produced by the time base circuit 30 control horizontal beam deflection, and the data in latch 49 is set such that the multiplexer 50 always selects the CHANGE TRACE signal output of time base circuit 30. When the oscilloscope is to operate in the chop mode, the data in latch 49 is set so that the CHANGE TRACE output of the chop clock 32 is selected by the multiplexer 50. In either case, multiplexer 50 forwards the selected CHANGE TRACE signal generated by the time base circuit 30 (or the chop clock 32) to a clock pulse generator 52. Clock pulse generator 52 produces a controlled width CLOCK signal pulse in response to each CHANGE TRACE signal from multiplexer 50 and the CLOCK signal pulse is applied to the control input of latch 48 which receives the data output of RAM 46 as its input. The leading edge of the CLOCK signal pulse causes latch 48 to latch the addressed attribute control data output of RAM 46 onto the control inputs of the attribute control switches 26, 28 and 36, and the time base circuit 30 so as to set the attributes for the trace being updated.

The CLOCK signal output pulse of the clock generator 52 is also applied to an input of an address generator circuit 54. In response to the trailing edge of the CLOCK signal pulse, the address generator 54 changes an output address applied to the read address port of RAM 46 so as to address a different storage location in RAM 46 corresponding to a next trace to be updated. The RAM 46 then reads out the attribute control data for the next trace, the data being applied to the input of latch 48. When the time base circuit 30 (or the chop clock 32) generates another CHANGE TRACE output signal to signify completion of a current trace update, the clock generator 52 generates another CLOCK signal pulse, the leading edge of which causes latch 48 to latch the current attribute control data output of RAM 46 to set the trace attributes for the next trace to be updated. Shortly thereafter, the trailing edge of the CLOCK signal pulse causes address generator 54 to read out the appropriate RAM 46 address of attribute data for yet another trace to be updated. Thus address generator 54 produces a sequence of addresses in response to a sequence of CLOCK pulses and these addresses cause RAM 46 to read out a sequence of attribute control data words, each word controlling the attribute of a different trace. Latch 48 acts as a one stage pipeline to buffer the attribute control data output of RAM 46 onto the control inputs of switches 26, 28 and 36 and time base circuit 30. As the last trace on the CRT is being updated, address generator 54 resets its address output to the address of the attribute control data for the first trace updated and the address sequence is generated again starting with the next CLOCK pulse. Thus all traces are repeatedly updated in sequential fashion.

Address generator 54 suitably comprises a programmable counter which generates output addresses by simply counting trailing edges of the CLOCK signal pulse output of clock generator 52, the current count comprising the address output of the generator. When the count reaches a limit determined by count limit data provided by microprocessor 42 via bus 40, address generator 54 resets the count to zero. Thus for example, if five traces are to be displayed on CRT 12, the microprocessor 42 stores the appropriate attribute control data for the five traces in the first five addresses in RAM 46, i.e., addresses zero to four, and sets the count limit for address generator 54 to four. The address generator 54 then produces a sequence of five addresses in response to a sequence of five CLOCK signal pulses from clock generator 52, starting with address zero and ending at address four. On the trailing edge of the next CLOCK signal pulse, address generator 54 resets its count to zero and resumes counting up in response to each subsequent CLOCK signal pulse. In this fashion the addressing of RAM 46 is continuously cycled from address zero to address four and back to address zero as the five traces are repeatedly updated. The number of traces to be displayed may be changed simply by changing the count limit of address generator 54 and appropriately adjusting the data in RAM 46.

Thus the count limit supplied to address generator 54 determines the number of traces to be displayed on CRT 12 while the data in RAM 46 determines the attributes of each trace. In alternative embodiments of the invention, address generator 54 may be implemented utilizing a state machine, programmed by microprocessor 42 by way of bus 40, or any other means for repeatedly producing a predetermined sequence of addresses in response to a sequence of CLOCK signal pulses from the clock generator 52 wherein each address of the sequence corresponds to a separate trace to be displayed on CRT 12. It is not necessary that the addresses be sequential.

While the present invention has been described in conjunction with an analog oscilloscope, it will be appreciated that the invention may also be utilized to control trace attributes in a digital oscilloscope. In a digital oscilloscope, the vertical channel switch determines which input signal may be applied to a digitizing circuit for producing a sequence of waveform data representing the input signal. The waveform data is stored in memory and utilized to control the shape of a "trace" on a digital oscilloscope screen. The sampling rate of the digitizer is controlled by a time base circuit and increasing the sampling rate in a digital oscilloscope has the same effect on the horizontal time scale of the trace as increasing the sweep rate in an analog oscilloscope. Thus the output of latch 48 of FIG. 1 could also provide control signals to the vertical channel switch and time base circuit of a digital oscilloscope so as to control the various attributes of each trace, while the time base circuit would be adapted to provide an appropriate CHANGE TRACE signal to a CLOCK pulse generator 52.

The trace attribute control system of the present invention is adapted to rapidly change the trace attributes between each trace update. Moreover, since the attributes for each trace are entirey controlled by data stored in RAM 46, and since the attribute data in RAM 46 for each trace can be independently adjusted, the trace attributes for any one trace may be adjusted independently of the trace attributes for any other trace, any trace may be assigned any possible combination of trace attributes, and any combination of traces having different attributes may be displayed simultaneously.

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

We claim:

1. A trace attribute controller for a multiple trace oscilloscope wherein multiple traces displayed on a screen are successively updated, comprising:
   addressable memory means for storing at separate addresses trace attribute control data corresponding to each of multiple input signals and for outputting said trace attribute control data when addressed,
   means for generating a succession of addresses for addressing said memory means;
   switch means receiving the input signals for providing one of the input signals as an output signal, said one input signal being selected in accordance with trace attribute control data output by said addressable memory means; and
   means for controlling an attribute of a trace according to the output signal of said switch means.

2. The trace attribute controller according to claim 1 wherein said addressable memory means comprises a random access memory.

3. The trace attribute controller according to claim 1 wherein said means for generating a succession of addresses comprises a counter.

4. The trace attribute controller according to claim 1 wherein said means for generating a succession of addresses comprises:
   means for generating a clock signal indicating a trace is to be updated; and
   a counter for maintaining a count of occurrences of said clock signal and for generating said succession of addresses according to said count.

5. The trace attribute controller according to claim 1 wherein said means for generating a succession of addresses comprises:
   means for generating a clock signal indicating a trace is to be updated; and
   means for maintaining a count of occurrences of said clock signal, said count being reset to a predetermined starting value each time said count reaches a predetermined ending value, and for generating said succession of addresses according to said count.

6. A trace attribute controller for a multiple trace oscilloscope wherein multiple traces displayed on a screen are successively updated, comprising:
   means for generating a clock signal each time a trace is to be updated;
   adressable memory means for storing at separate addresses trace attribute control data corresponding to each of multiple input signals and for outputting said trace attribute control data when addressed;
   means for generating a succession of addresses for addressing said addressable memory means, each address of said succession of addresses being generated in response to said clock signal;
   latch means input enabled by said clock signal for storing said trace attribute control data output of said addressable memory means;
   switch means receiving the input signals for providing one of the input signals as an output signal, said one input signal being selected in accordance with trace attribute control data stored by said latch means; and
   means for controlling an attribute of a trace according to the output signal of said switch means.

7. The trace attribute controller according to claim 6 wherein said addressable memory means comprises a random access memory.

8. The trace attribute controller according to claim 6 wherein said means for generating a succession of addresses comprises a programmable counter for maintaining a count of occurrences of said clock signal, said count being reset to a predetermined starting value each time said count reaches a predetermined ending value, and for generating said succession of addresses according to said count.

9. A trace controller for an instrument that generates multiple traces representing input signals by moving a beam across a screen, the trace controller comprising:
   addressable memory means storing at separate addresses trace attribute control data corresponding to separate ones of said multiple traces for outputting trace attribute control data when addressed;
   switch means receiving said input signals for providing a selected one of the input signals as an output signal, said one input signal being selected in accordance with trace attribute control data output by said addressable memory means;
   means for controlling an attribute of said beam in response to said output signal; and
   means for successively addressing said memory means such that said addressable memory means outputs a sequence of trace attribute control data, each data of said sequence corresponding to a separate one of said multiple traces.

10. A trace controller for an instrument having a screen for displaying multiple traces generated by a beam moving across the screen, comprising:
    addressable memory means storing at separate addresses trace attribute control data corresponding to separate ones of said multiple traces, for outputting trace attribute control data when addressed;
    switch means receiving multiple input signals for providing ones of the input signals as output signals, said ones of said input signals being selected in accordance with trace attribute control data output by said addressable memory means;
    means for controlling movement of the beam in accordance with one of said output signals; and
    means for successively addressing said memory means such that said addressable memory means outputs a sequence of trace attribute control data, each data of said sequence corresponding to a separate one of said multiple traces.

11. The trace controller in accordance with claim 10 further comprising means for controlling the intensity of said beam in accordance with another of said output signals.

12. A trace controller for an instrument having a screen for displaying multiple traces generated by a beam moving across the screen, comprising:
    addressable memory means storing at separate addresses trace attribute control data corresponding to separate ones of the multiple traces for outputting trace attribute control data when addressed;
    first switch means receiving a plurality of oscilloscope input signals for providing a selected one of the input signals as a first output signal, said one input signal being selected in accordance with trace attribute control data output by said addressable memory means;

means for controlling vertical movement of the beam across said screen in accordance with the first output signal;
means for generating a plurality of sweep signals;
second switch means receiving said plurality of sweep signals and providing a selected one of the sweep signals as a second output signal, said one sweep signal being selected in accordance with the trace attribute control data output by said addressable memory means;
means for controlling horizontal movement of the beam across said screen in accordance with the second output signal; and
means for successively addressing said memory means such that said addressable memory means outputs a sequence of trace attribute control data, each data of said sequence corresponding to a separate one of said multiple traces.

13. The trace controller in accordance with claim 12 further comprising:
third switch means receiving a plurality of intensity control signals and providing one of the intensity control signals as a third output signal, said one intensity control signal being selected in accordance with the trace attribute control data output by said addressable memory means; and
means for controlling the intensity of the beam in accordance with the third output signal.

* * * * *